United States Patent
Kim et al.

(10) Patent No.: US 12,002,426 B2
(45) Date of Patent: Jun. 4, 2024

(54) PIXEL AND ORGANIC LIGHT-EMITTING DISPLAY APPARATUS

(71) Applicant: Samsung Display Co., Ltd., Yongin-si (KR)

(72) Inventors: Sunghwan Kim, Yongin-si (KR); Eunju Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/084,096

(22) Filed: Dec. 19, 2022

(65) Prior Publication Data

US 2023/0134395 A1      May 4, 2023

Related U.S. Application Data

(63) Continuation of application No. 17/198,068, filed on Mar. 10, 2021, now Pat. No. 11,532,272.

(30) Foreign Application Priority Data

Jun. 30, 2020   (KR) .................. 10-2020-0080497

(51) Int. Cl.
    *G09G 3/3233*   (2016.01)
    *H10K 59/121*   (2023.01)

(52) U.S. Cl.
    CPC ... *G09G 3/3233* (2013.01); *G09G 2300/0421* (2013.01); *G09G 2300/0819* (2013.01); *G09G 2320/0252* (2013.01); *H10K 59/1216* (2023.02)

(58) Field of Classification Search
    CPC ......... G09G 3/3233; G09G 2300/0421; G09G 2300/0819; G09G 2320/0252

(Continued)

(56) References Cited

U.S. PATENT DOCUMENTS 9,780,331 B2 * 10/2017 Lee ...................... H10K 50/844
10,263,058 B2   4/2019 Lee et al.
(Continued)

FOREIGN PATENT DOCUMENTS

CN    110992880    4/2020
EP    3839932     6/2021
(Continued)

OTHER PUBLICATIONS

Notice of Allowance dated Aug. 17, 2022, in U.S. Appl. No. 17/198,068.

*Primary Examiner* — Calvin C Ma
(74) *Attorney, Agent, or Firm* — KILE PARK REED & HOUTTEMAN PLLC

(57) ABSTRACT

A pixel includes a light-emitting device, a driving TFT for controlling a magnitude of a current from a power line to the light-emitting device according to a gate-source voltage, a storage capacitor disposed between the power line and a gate of the driving TFT, a scan TFT to transfer a data voltage to a source of the driving TFT in response to a first signal, first and second compensation TFTs serially connected between a drain and the gate of the driving TFT, a gate initialization TFT to apply a first voltage to the gate of the driving TFT in response to a second signal, an anode initialization TFT to apply a second voltage to an anode of the light-emitting device in response to a third signal, and a shield capacitor disposed between a node between the first and second compensation TFTs and the power line or a second voltage line.

20 Claims, 8 Drawing Sheets

(58) Field of Classification Search
USPC .......................................................... 345/214
See application file for complete search history.

(56) References Cited

U.S. PATENT DOCUMENTS

| | | |
|---|---|---|
| 11,386,854 B2 | 7/2022 | Kim et al. |
| 11,532,272 B2* | 12/2022 | Kim ..................... G09G 3/3233 |
| 11,552,146 B2 | 1/2023 | Lee et al. |
| 2018/0218686 A1 | 8/2018 | Li |
| 2019/0103054 A1 | 4/2019 | Chang |
| 2019/0266946 A1* | 8/2019 | Zhu ..................... G09G 3/3233 |
| 2020/0044009 A1 | 2/2020 | Kwak et al. |
| 2020/0212161 A1* | 7/2020 | Choi .................... G09G 3/3258 |

FOREIGN PATENT DOCUMENTS

| | | |
|---|---|---|
| KR | 10-2016-0129157 | 11/2016 |
| KR | 10-2019-0067295 | 6/2019 |
| KR | 10-2017764 | 9/2019 |
| KR | 10-2020-0016425 | 2/2020 |
| KR | 10-2020-0019306 | 2/2020 |

\* cited by examiner

PIXEL AND ORGANIC LIGHT-EMITTING DISPLAY APPARATUS

CROSS-REFERENCE TO RELATED APPLICATION

This application is a Continuation of U.S. patent application Ser. No. 17/198,068, filed Mar. 10, 2021, which claims priority from and the benefit of Korean Patent Application No. 10-2020-0080497, filed on Jun. 30, 2020, which are hereby incorporated by reference for all purposes as if fully set forth herein.

BACKGROUND

Field

Exemplary embodiments of the invention relate generally to a pixel and an organic light-emitting display apparatus.

Discussion of the Background

An organic light-emitting display apparatus includes a light-emitting device, e.g., an organic light-emitting diode, having a brightness varying depending on a current. One pixel in the organic light-emitting display apparatus includes an organic light-emitting diode, a driving transistor controlling an amount of a current supplied to the organic light-emitting diode according to a voltage between a gate terminal and a source terminal, a switching transistor configured to transfer to the driving transistor a data voltage for controlling a luminance of the organic light-emitting diode, and a storage capacitor for storing the data voltage. When the data voltage stored in the storage capacitor is not maintained constant for one frame, the luminance of the organic light-emitting diode varies.

In addition, before writing the data voltage in the pixel, an initialization voltage is applied to a gate of the driving transistor. When the same initialization voltage is applied to an anode of the organic light-emitting diode before the organic light-emitting diode emits light, light emission may be delayed due to a capacitor characteristic of the organic light-emitting diode.

The above information disclosed in this Background section is only for understanding of the background of the inventive concepts, and, therefore, it may contain information that does not constitute prior art.

SUMMARY

Devices constructed according to exemplary embodiments of the invention include pixels, by which a resolution and a pixel size may be maintained and an emission delay issue may be addressed, by applying an existing design rule without degrading crosstalk characteristics, a layout of the pixels, and an organic light-emitting display apparatus including the pixels.

Additional features of the inventive concepts will be set forth in the description which follows, and in part will be apparent from the description, or may be learned by practice of the inventive concepts.

According to one or more exemplary embodiments, a pixel receives first to third scan signals and a data voltage, and is connected to a power line configured to transfer a driving voltage and first and second voltage lines configured to respectively transfer first and second initialization voltages The pixel includes a light-emitting device, a driving thin film transistor (TFT) for controlling a magnitude of a current flowing from the power line to the light-emitting device according to a gate-source voltage, a storage capacitor between the power line and a gate of the driving TFT, a scan TFT configured to transfer the data voltage to a source of the driving TFT in response to the first scan signal, first and second compensation TFTs operating in response to the first scan signal and serially connected to each other between a drain and the gate of the driving TFT, a gate initialization TFT configured to apply the first initialization voltage to the gate of the driving TFT in response to the second scan signal, an anode initialization TFT configured to apply the second initialization voltage to an anode of the light-emitting device in response to the third scan signal, and a shield capacitor between a floating node between the first and second compensation TFTs and the power line or the second voltage line.

The pixel may include a semiconductor layer with a first compensation channel region of the first compensation TFT, a second compensation channel region of the second compensation TFT, and a conductive region between the first and second compensation channel regions as a lower electrode of the shield capacitor; a first conductive layer including first and second gate electrodes of the first and second compensation TFTs; and a second conductive layer on the first conductive layer, the second conductive layer comprising an upper electrode of the shield capacitor, which at least partially overlaps the conductive region of the semiconductor layer.

The first conductive layer may further include a lower electrode of the storage capacitor and first to third scan lines configured to respectively transfer the first to third scan lines, the second conductive layer may further include an upper electrode of the storage capacitor and the first and second voltage lines, and the first to third scan lines and the first and second voltage lines extend in a first direction.

The pixel may further include a third conductive layer on the second conductive layer, the third conductive layer having the power line and a data line configured to transfer the data voltage; and a fourth conductive layer on the third conductive layer, the fourth conductive layer having an anode of the light-emitting device, wherein the power line and the data line extend in a second direction.

The upper electrode of the shield capacitor may be a part of the second voltage line.

The third conductive layer may further include a first connecting electrode that connects the upper electrode of the shield capacitor in the second conductive layer with the upper electrode of the storage capacitor in the second conductive layer.

The semiconductor layer may further include a drain region of the anode initialization TFT and a drain region of the gate initialization TFT, and the third conductive layer may include: a second connecting electrode connecting the second voltage line of the second conductive layer with the drain region of the anode initialization TFT of the semiconductor layer; and a third connecting electrode connecting the first voltage line of the second conductive layer with the drain region of the gate initialization TFT of the semiconductor layer.

The second scan line may be between the first voltage line and the second voltage line and the second voltage line may be between the second scan line and the first scan line.

The pixel may further include a first emission control TFT connecting the power line to the source of the driving TFT in response to an emission control signal; and a second emission control TFT connecting the drain of the driving TFT to the anode of the light-emitting device in response to the emission control signal.

A level of the second initialization voltage may be higher than a level of the first initialization voltage.

According to one or more exemplary embodiments, a pixel is connected to first to third scan lines configured to respectively transfer first to third scan signals, an emission control line configured to transfer an emission control signal, a data line configured to transfer a data voltage, a power line configured to transfer a driving voltage, and first and second voltage lines configured to respectively transfer first and second initialization voltages. The pixel includes a light-emitting device including an anode and a cathode, a storage capacitor including an upper electrode and a lower electrode connected to the power line, a first thin film transistor (TFT) including a gate connected to the storage capacitor, a source connected to the power line, and a drain, a second TFT including a gate connected to the first scan line, a source connected to the data line, and a drain connected to the source of the first TFT, a third TFT including a first compensation TFT including a gate connected to the first scan line, a source connected to a floating node, and a drain connected to the gate of the first TFT, and a second compensation TFT including a gate connected to the first scan line, a source connected to the drain of the first TFT, and a drain connected to the floating node, a fourth TFT including a gate connected to the second scan line, a source connected to the gate of the first TFT, and a drain connected to the first voltage line, a fifth TFT including a gate connected to the emission control line, a source connected to the power line, and a drain connected to the source of the first TFT, a sixth TFT including a gate connected to the emission control line, a source connected to the drain of the first TFT, and a drain connected to the anode of the light-emitting device, a seventh TFT including a gate connected to the third scan line, a source connected to the anode of the light-emitting device, and a drain connected to the second voltage line, and a shield capacitor including a lower electrode connected to the floating node, and an upper electrode to which the second initialization voltage or the driving voltage is applied.

The pixel may further include: a semiconductor layer having active regions of the first to seventh TFTs, and a conductive region functioning as the lower electrode of the shield capacitor; a first conductive layer on the semiconductor layer, the first conductive layer having gate electrodes of the first to seventh TFTs, the lower electrode of the storage capacitor, the first to third scan lines, and the emission control line; and a second conductive layer on the first conductive layer, the second conductive layer including the upper electrode of the storage capacitor, the upper electrode of the shield capacitor, and the first and second voltage lines, wherein the conductive region of the semiconductor layer and the upper electrode of the shield capacitor in the second conductive layer overlap each other.

The pixel may further include: a third conductive layer on the second conductive layer, the third conductive layer having the power line and the data line; and a fourth conductive layer on the third conductive layer, the fourth conductive layer having the anode of the light-emitting device.

The upper electrode of the shield capacitor may be a part of the second voltage line.

The third conductive layer may further include a first connecting electrode that connects the upper electrode of the shield capacitor in the second conductive layer with the upper electrode of the storage capacitor in the second conductive layer.

The semiconductor layer may further include a drain region of the seventh TFT, and the third conductive layer may further include a second connecting electrode connecting the second voltage line of the second conductive layer to the drain region of the seventh TFT in the semiconductor layer.

The semiconductor layer may further include a drain region of the fourth TFT, and the third conductive layer may further include a third connecting electrode connecting the first voltage line of the second conductive layer to the drain region of the fourth TFT in the semiconductor layer.

According to one or more exemplary embodiments, a display apparatus includes a substrate extending in a first direction and a second direction, first to third scan lines configured to respectively transfer first to third scan signals, the first to third scan lines extending in the first direction, a data line configured to transfer a data voltage and extending in the second direction, a power line configured to transfer a driving voltage, first and second voltage lines configured to respectively transfer first and second initialization voltages and extending in the first direction, and a plurality of pixels provided on the substrate in the first direction and the second direction. Each of the plurality of pixels includes a light-emitting device, a driving thin film transistor (TFT) for controlling a magnitude of a current flowing from the power line to the light-emitting device according to a gate-source voltage, a storage capacitor between the power line and a gate of the driving TFT, a scan TFT configured to transfer the data voltage to a source of the driving TFT in response to the first scan signal, first and second compensation TFTs connected to each other in series to connect the drain of the driving TFT to the gate of the driving TFT in response to the first scan signal, a gate initialization TFT configured to apply the first initialization voltage to the gate of the driving TFT in response to the second scan signal, an anode initialization TFT configured to apply the second initialization voltage to an anode of the light-emitting device in response to the third scan signal, and a shield capacitor between a floating node between the first and second compensation TFTs and the power line or the second voltage line.

The organic light-emitting display apparatus may include an emission control line configured to transfer an emission control signal and extending in the first direction, wherein each of the plurality of pixels includes: a first emission control TFT connecting the power line to the source of the driving TFT in response to the emission control signal; and a second emission control TFT connecting the drain of the driving TFT to the anode of the light-emitting device in response to the emission control signal.

The shield capacitor may include an upper electrode, a lower electrode, and a dielectric layer between the upper electrode and the lower electrode, wherein the lower electrode may include a conductive region of the semiconductor layer, and the upper electrode may be a part of the second voltage line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
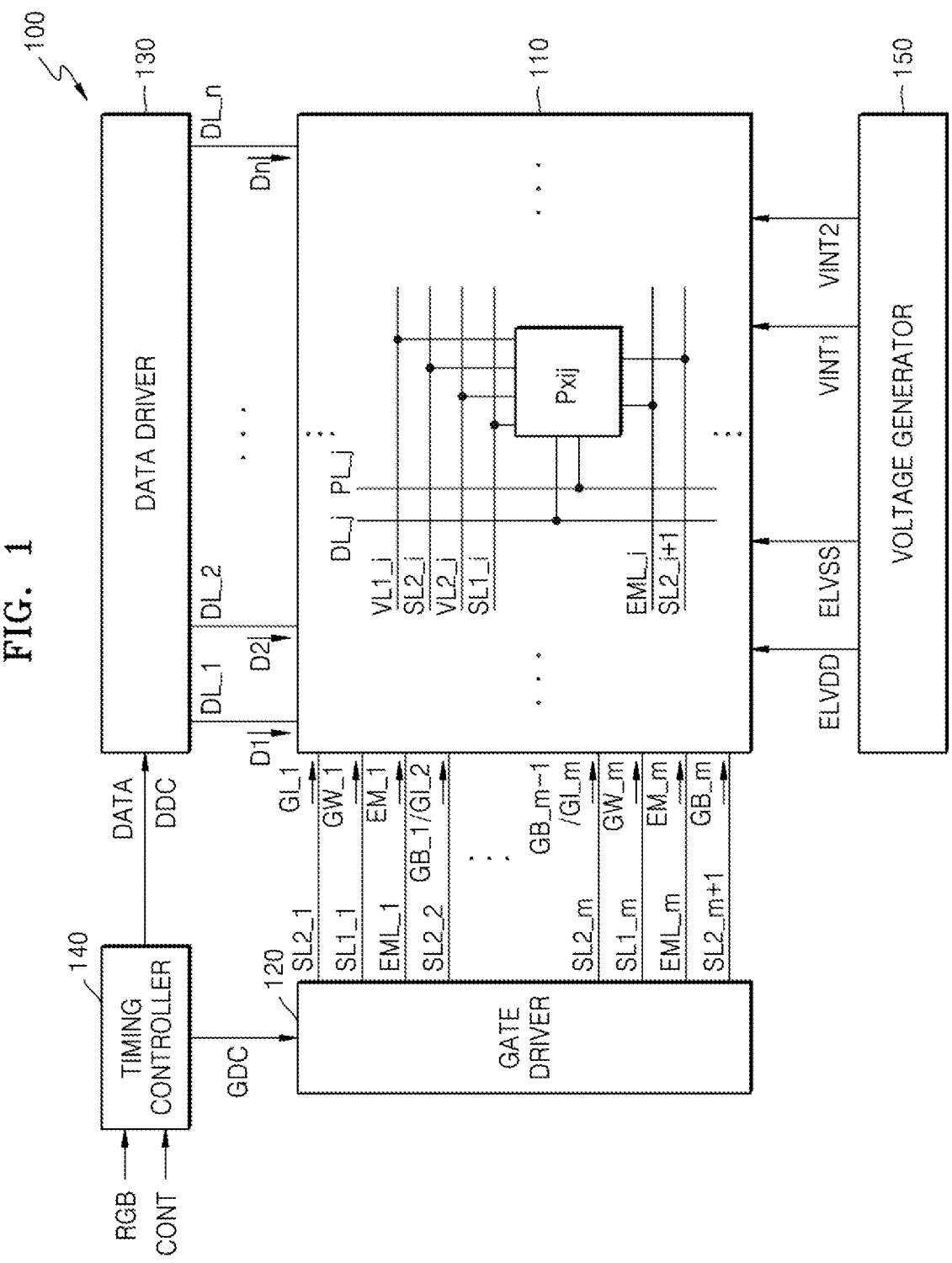
FIG. 1 is a block diagram of an organic light-emitting display apparatus according to an exemplary embodiment of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a block diagram of an organic light-emitting display apparatus 100 according to an exemplary embodiment.

Referring to FIG. 1, the organic light-emitting display apparatus 100 includes a display 110, a gate driver 120, a data driver 130, a timing controller 140, and a voltage generator 150.

The display 110 includes pixels PX, e.g., a pixel PXij at an i-th row and a j-th column. For convenience of appreciation, FIG. 1 only shows one pixel PXij, but m☐n pixels PX may be arranged, e.g., in a matrix. Here, i is a natural number ranging from 1 to m and j is a natural number ranging from 1 to n.

The pixels PX are connected to first scan lines SL1_1 to SL1_m, second scan lines SL2_1 to SL2_m+1, emission control lines EML_1 to EML_m, and data lines DL_1 to DL_n. The pixels PX are connected to power lines PL_1 to PL_n, first voltage lines VL1_1 to VL1_m, and second voltage lines VL2_1 to VL2_m. For example, as shown in FIG. 1, the pixel PXij at the i-th row and the j-th column may be connected to the first scan line SL1_i, the second scan line SL2_i, the emission control line EML_i, the data line DL_j, the power line PL_j, the first voltage line VL1_i, the second voltage line VL2_i, and the second scan line SL2_i+1. The second scan line SL2_i+1 may be referred to as a third scan line with respect to the pixel PXij.

The first scan lines SL1_1 to SL1_m, the second scan lines SL2_1 to SL2_m+1, the emission control lines EML_1 to EML_m, the first voltage lines VL1_1 to VL1_m, and the second voltage lines VL2_1 to VL2_m may extend in a first direction (e.g., a row direction) to be connected to the pixels PX in the same row. The data lines DL_1 to DL_n and the power lines PL_1 to PL_n may extend in a second direction (e.g., a column direction) to be connected to the pixels PX in the same column.

The first scan lines SL1_1 to SL1_m are configured to transfer first scan signals GW_1 to GW_m output from the gate driver 120 to the pixels PX in the same row, the second scan lines SL2_1 to SL2_m are configured to transfer second scan signals GI_1 to GI_m output from the gate driver 120 to the pixels PX in the same row, and the second scan lines SL2_2 to SL2_m+1 are configured to transfer third scan signals GB_1 to GB_m output from the gate driver 120 to the pixels PX in the same row. The second scan signal GI_i and the third scan signal GB_i−1 may be actually the same signal transferred through the second scan line SL2_i.

The emission control lines EML_1 to EML_m are configured to respectively transfer emission control signals EM_1 to EM_m output from the gate driver 120 to the pixels PX in the same row. The data lines DL_1 to DL_n are configured to respectively transfer data voltages D1 to Dm output from the data driver 130 to the pixels PX in the same column. The pixel PXij at the i-th row and the j-th column receives the first to third scan signals GW_i, GI_i, and GB_i, the data voltage Dj, and the emission control signal EM_i.

The power lines PL_1 to PL_n are configured to transfer the first driving voltage ELVDD output from the voltage generator 150 respectively to the pixels PX in the same column. The first voltage lines VL1_1 to VL1_m are configured to transfer a first initialization voltage VINT1 output from the voltage generator 150 respectively to the pixels PX in the same row. The second voltage lines VL2_1 to VL2_m are configured to transfer second initialization voltages VINT2 output from the voltage generator 150 respectively to the pixels PX in the same row.

The pixel PXij includes a driving thin film transistor (TFT) that controls the light-emitting device and a magnitude of a current flowing to the light-emitting device based on a data voltage Dj. The data voltage Dj is output from the data driver 130 and received by the pixel PXij via the data line DL_j. The light-emitting device may be, for example, an organic light-emitting diode. When the light-emitting device emits light of a brightness corresponding to the magnitude of the current transmitted from the driving TFT, the pixel PXij may represent a gray scale corresponding to the data voltage Dj. The pixel PX may correspond to a part, e.g., a sub-pixel, of a unit pixel capable of displaying full-color images. The pixel PXij may further include at least one switching TFT and at least one capacitor. The pixel PXij will be described in more detail below.

The voltage generator 150 may generate voltages necessary for driving the pixel PXij. For example, the voltage generator 150 may generate the first driving voltage ELVDD, a second driving voltage ELVSS, the first initialization voltage VINT1, and the second initialization voltage VINT2. The first driving voltage ELVDD may have a higher level than that of the second driving voltage ELVSS. The second initialization voltage VINT2 may have a higher level than that of the first initialization voltage VINT1. The second initialization voltage VINT2 may have a higher level than that of the second driving voltage ELVSS. A difference between the second initialization voltage VINT2 and the second driving voltage ELVSS may be less than a threshold voltage that is necessary for the light-emitting device of the pixel PX to emit light.

Although not shown in FIG. 1, the voltage generator 150 may generate a first gate voltage VGH and a second gate voltage VGL for controlling the switching TFT of the pixel PXij and provide the voltages to the gate driver 120. When the first gate voltage VGH is applied to a gate of the switching TFT, the switching TFT is turned off, and when the second gate voltage VGL is applied to the gate of the switching TFT, the switching TFT is turned on. The first gate voltage VGH may be referred to as a gate-off voltage, and the second gate voltage VGL may be referred to as a gate-on voltage. The switching TFTs in the pixel PXij may include a p-type MOSFET, and the first gate voltage VGH may have a higher level than that of the second gate voltage VGL. Although not shown in FIG. 1, the voltage generator 150 may generate and provide gamma reference voltages to the data driver 130.

The timing controller 140 may control the display 110 by controlling operating timings of the gate driver 120 and the data driver 130. The pixels PX in the display 110 receive a new data voltage D for each frame period and emit light of a luminance corresponding to the data voltage D, and then, an image corresponding to image source data RGB for one frame may be displayed. According to an exemplary embodiment, one frame period may include a gate initialization period, a data writing and anode initialization period, and an emission period. In the gate initialization period, the first initialization voltage VINT1 may be applied to the pixels PX in synchronization with the second scan signal GI. In the data writing and anode initialization period, the data voltage D is provided to the pixels PX in synchronization with the first scan signal GW, and the second initialization voltage VINT2 may be applied to the pixels PX in synchronization with the third scan signal GB. In the emission period, the pixels PX of the display 110 emit light.

The timing controller 140 receives the image source data RGB and a control signal CONT from outside. The timing controller 140 may convert the image source data RGB to image data DATA based on characteristics of the display 110 and the pixels PX. The timing controller 140 may provide the image data DATA to the data driver 130.

The control signal CONT may include a vertical synchronization signal Vsync, a horizontal synchronization signal Hsync, a data enable signal DE, a clock signal CLK, etc. The timing controller 140 may control operation timings of the gate driver 120 and the data driver 130 by using the control signal CONT. The timing controller 140 may determine the frame period by counting the data enable signals DE during one horizontal scanning period. In this case, the vertical synchronization signal Vsync and the horizontal synchronization signal Hsync supplied from outside may be omitted. The image source data RGB includes luminance information of the pixels PX. The luminance may have gray scales of a preset number, for example, $1024(=2^{10})$, $256(=2^8)$, or $64(=2^6)$ gray scales.

The timing controller 140 may generate control signals including a gate timing control signal GDC for controlling the operation timings of the gate driver 120 and a data timing control signal DDC for controlling the operation timings of the data driver 130.

The gate timing control signal GDC may include a gate start pulse (GSP), a gate shift clock (GSC), and a gate output enable (GOE) signal. The GSP is supplied to the gate driver 120 that generates a first scan signal at a time of starting the scanning period. The GSC is a clock signal commonly input to the gate driver 120 for shifting the GSP. The GOE signal controls an output from the gate driver 120.

The data timing control signal DDC may include a source start pulse (SSP), a source sampling clock (SSC), a source output enable (SOE) signal, etc. The SSP controls a data sampling start point of the data driver 130, and is provided to the data driver 130 at the point of starting the scanning period. The SSC is a clock signal for controlling data sampling operations in the data driver 130 based on a rising edge or a falling edge. The SOE signal controls an output from the data driver 130. In addition, the SSP supplied to the data driver 130 may be omitted, based on a data transmission method.

The gate driver 120 sequentially generates the first scan signals SW_1 to SW_m, the second scan signals GI_1 to GI_m, and the third scan signals GB_1 to GB_m by using the first and second gate voltages VGH and VGL provided from the voltage generator 150, in response to the gate timing control signal GDC supplied from the timing controller 140.

The data driver 130 samples and latches the image data DATA supplied from the timing controller 140 in response to the data timing control signal DDC supplied from the timing controller 140 in order to convert the image data DATA into data of a parallel data system. When converting the image data DATA into the data of the parallel data system, the data driver 130 converts the image data DATA into a gamma reference voltage and then converts the gamma reference voltage into an analog-type data voltage. The data driver 130 provides the data voltages D1 to Dm to the pixels PX via the data lines DL_1 to DL_n. The pixels PX receive the data voltages D1 to Dn in response to the first scan signals GW_1 to GW_m.

Figure 2:
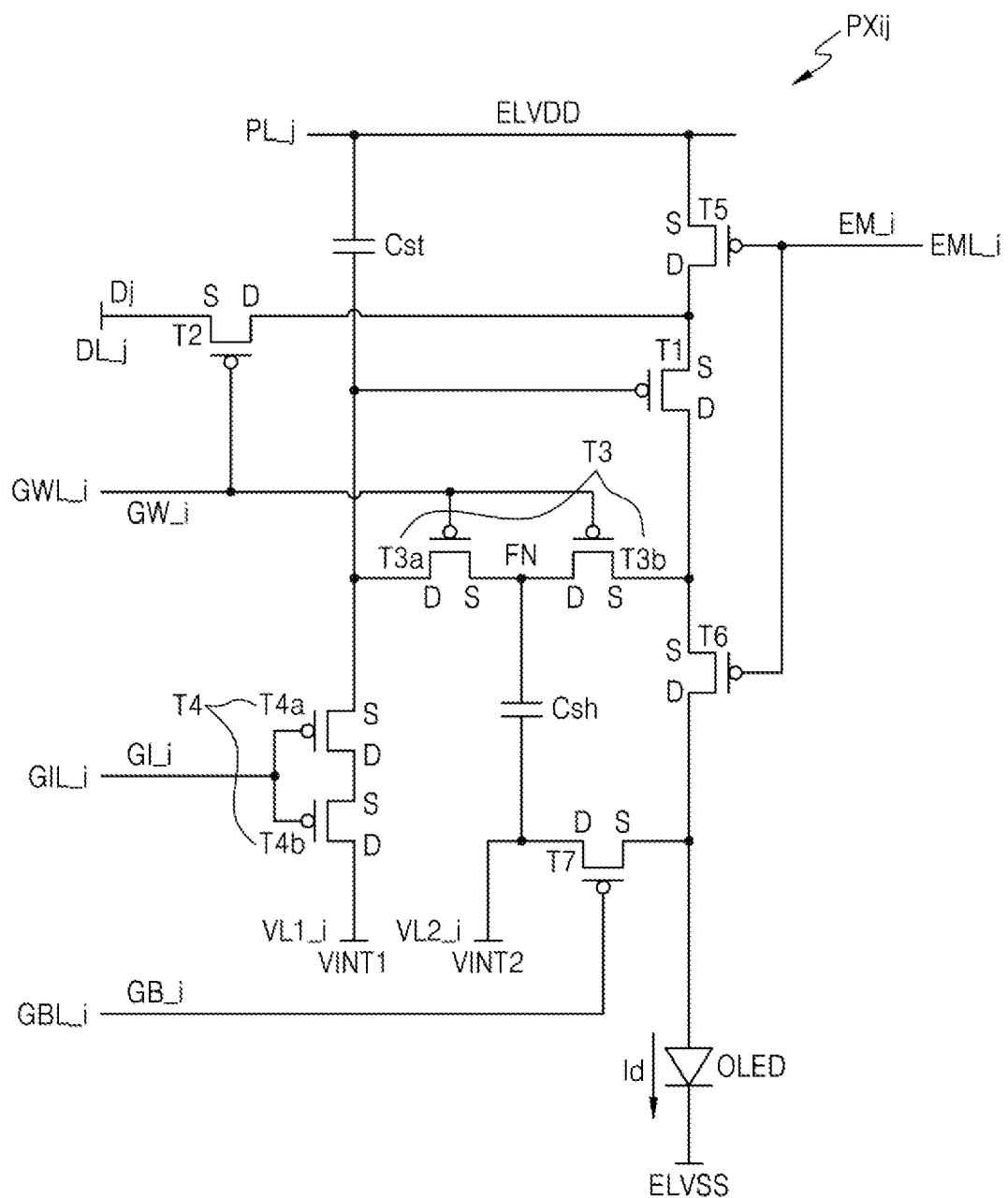
FIG. 2 is an equivalent circuit diagram of a pixel according to an exemplary embodiment of the invention.

FIG. 2 is an equivalent circuit diagram of the pixel PXij according to an exemplary embodiment.

Referring to FIG. 2, the pixel PXij is connected to first to third scan lines GWL_i, GIL_i, and GBL_i for respectively transferring the first to third scan signals GW_i, GI_i, and GB_i, the data line DL_j for transferring the data voltage Dj, and an emission control line EML_i for transferring an emission control signal. The pixel PXij is connected to the power line PL for transferring the first driving voltage ELVDD, the first voltage line VL1_i for transferring the first initialization voltage VINT1, and the second voltage line VL2_i for transferring the second initialization voltage VINT2. The pixel PXij is connected to a common electrode to which the second driving voltage ELVSS is applied. The pixel PXij may correspond to the pixel PXij of FIG. 1.

The first scan line GWL_i corresponds to the first scan line SL1_i of FIG. 1, the second scan line GIL_i corresponds to the second scan line SL2_i of FIG. 1, and the third scan line GBL_i corresponds to the second scan line SL2_i+1 of FIG. 1.

The pixel PXij includes a light-emitting device OLED, first to seventh TFTs T1 to T7, a storage capacitor Cst, and a shield capacitor Csh. The light-emitting device OLED may include an organic light-emitting diode including an anode and a cathode. The cathode may include a common electrode to which the second driving voltage ELVSS is applied.

The first TFT T1 may be a driving transistor, in which a magnitude of a drain current is determined according to a gate-source voltage, and the second to seventh TFTs T2 to T7 may be switching transistors that are actually turned on/off according to the gate-source voltage, e.g., a gate voltage. The third TFT T3 includes a first compensation TFT T3a and a second compensation TFT T3b that are connected to each other in series.

The first TFT T1 may be referred to as the driving TFT, the second TFT T2 may be referred to as a scan TFT, the third TFT T3 may be referred to as a compensation TFT, the fourth TFT T4 may be referred to as a gate initialization TFT, the fifth TFT T5 may be referred to as a first emission control TFT, the sixth TFT T6 may be referred to as a second emission control TFT, and the seventh TFT T7 may be referred to as an anode initialization TFT.

The storage capacitor Cst is connected between the power line PL_j and a gate of the driving TFT_T1. The storage capacitor Cst may have an upper electrode connected to the power line PL_j and a lower electrode connected to the gate of the driving TFT T1.

The driving TFT T1 may control a magnitude of a driving current Id flowing from the power line PL_j to the light-emitting device OLED according to a gate-source voltage. The driving TFT T1 may have the gate connected to the lower electrode of the storage capacitor Cst, a source connected to the power line PL_j via the first emission control TFT T5, and a drain connected to the light-emitting device OLED via the second emission control TFT T6.

The driving TFT T1 may output the driving current Id to the light-emitting device OLED according to the gate-source voltage. The magnitude of the driving current Id is determined based on a difference between the gate-source voltage of the driving TFT T1 and a threshold voltage. The light-emitting device OLED receives the driving current Id from the driving TFT T1 and may emit light at a brightness according to the magnitude of the driving current Id.

The scan TFT T2 is configured to transfer the data voltage Dj to the source of the driving TFT T1 in response to the first scan signal GW_i. The scan TFT T2 may have a gate connected to the first scan line SWL_i, a source connected to the data line GL_j, and a drain connected to the source of the driving TFT T1.

The first and second compensation TFTs T3a and T3b are connected between the drain and the gate of the driving TFT T1 in series, and connect the drain and gate of the driving TFT T1 to each other in response to the first scan signal GW_i. A node between the first and second compensation TFTs T3a and T3b is referred to as a floating node FN. The first compensation TFT T3a may have a gate connected to the first scan line GWL_i, a source connected to the floating node FN, and a drain connected to the gate of the driving TFT T1. The second compensation TFT T3b may have a gate connected to the first scan line GWL_i, a source connected to the drain of the driving TFT T1, and a drain connected to the floating node FN.

The shield capacitor Csh is connected between the floating node FN and the second voltage line VL2_i. The shield capacitor Csh may have an upper electrode connected to the second voltage line VL2_i and a lower electrode connected to the floating node FN. The upper electrode of the shield capacitor Csh may be a part of the second voltage line VL2_i.

When there is no shield capacitor Csh, the floating node FN floats when the first and second compensation TFTs T3a and T3b are turned off. Thus, an electric potential of the floating node FN may fluctuate according to a voltage variation in peripheral signal lines, and charges stored in the storage capacitor Cst may slowly leak through the first and second compensation TFTs T3a and T3b.

According to an exemplary embodiment, even when the first and second compensation TFTs T3a and T3b are turned off, the second initialization voltage VINT2 is continuously applied to the upper electrode of the shield capacitor Csh, and thus, the voltage at the floating node FN may be maintained due to the shield capacitor Csh. There is a parasitic capacitance between the floating node FN and other signal lines. Even when voltages of the other signal lines change, the variation in the voltage of the floating node FN may be noticeably reduced by the shield capacitor Csh.

The gate initialization TFT T4 applies the first initialization voltage VINT1 to the gate of the driving TFT T1 in response to the second scan signal GI_i. The gate initialization TFT T4 may have a gate connected to the second signal line GIL_i, a source connected to the gate of the driving TFT T1, a drain connected to the first voltage line VL1_i.

As shown in FIG. 2, the gate initialization TFT T4 may include a first initialization TFT T4a and a second initialization TFT T4b that are connected to each other in series between the gate of the driving TFT T1 and the first voltage line VL1_i. The first initialization TFT T4a may have a gate connected to the second signal line GIL_i, a source connected to the gate of the driving TFT T1, and a drain connected to the second initialization TFT T4b. The second initialization TFT T4b may have a gate connected to the second signal line GIL_i, a source connected to the drain of the first initialization TFT T4a, and a drain connected to the first voltage line VL1_i.

The anode initialization TFT T7 applies the second initialization voltage VINT2 to the light-emitting device OLED in response to the third scan signal GB_i. The anode initialization TFT T7 may have a gate connected to the second signal line GBL_i, a source connected to the anode of the light-emitting device OLED, and a drain connected to the second voltage line VL2_i.

The first emission control TFT T5 may connect the power line PL_j and the source of the driving TFT T1 to each other in response to the emission control signal EM_i. The first emission control TFT T5 may have a gate connected to the emission control line EML_i, a source connected to the power line PL_j, and a drain connected to the source of the driving TFT T1.

The second emission control TFT T6 may connect the drain of the driving TFT T1 to the anode of the light-emitting device OLED in response to the emission control signal EM_i. The second emission control TFT T6 may have a gate connected to the emission control line EML_i, a source connected to the drain of the driving TFT T1, and a drain connected to the anode of the light-emitting device OLED.

The second scan signal GI_i may be substantially synchronized with a first scan signal GW_i−1 of a previous row. The third scan signal GB_i may be substantially synchronized with the first scan signal GW_i. According to another example, the third scan signal GB_i may be substantially synchronized with a first scan signal GW_i+1 of a next row.

Hereinafter, detailed operations of one pixel in an organic light-emitting display apparatus according to an exemplary embodiment will be described below.

When receiving an emission control signal EM_i of a high level, the first emission control TFT T5 and the second emission control TFT T6 are turned off, the driving TFT T1 stops outputting the driving current Id, and the light-emitting device OLED stops emitting light.

After that, during a gate initialization period in which the second scan signal GI_i of a low level is received, the gate initialization TFT T4 is turned on, and the first initialization voltage VINT1 is applied to the gate of the driving TFT T1, that is, the lower electrode of the storage capacitor Cst. The storage capacitor Cst stores a difference (ELVDD-VINT1) between the driving voltage ELVDD and the first initialization voltage VINT1.

After that, during a data writing period in which the first scan signal GW_i of a low level is received, the scan TFT T2 and the compensation TFT T3 are turned on, and the data voltage Dj is received by the source of the driving TFT T1. The driving TFT T1 is diode-connected due to the compensation TFT T3, and is forwardly biased. The gate voltage of the driving TFT T1 elevates from the first initialization voltage VINT1. When the gate voltage of the driving TFT T1 is equal to a data compensation voltage (Dj−|Vth|) which is reduced by a threshold voltage Vth of the driving TFT T1 from the data voltage Dj, the driving TFT T1 is turned off and the gate voltage of the driving TFT T1 stops elevating. Accordingly, the storage capacitor Cst stores a difference (ELVDD-Dj+|Vth|) between the driving voltage ELVDD and the data compensation voltage (Dj−|Vth|).

Also, during an anode initialization period in which the third scan signal GB_i of a low level is received, the anode initialization TFT T7 is turned on and the second initialization voltage VINT2 is applied to the anode of the light-emitting device OLED. When the second initialization voltage VINT2 is applied to the anode of the light-emitting device OLED to make the light-emitting device OLED be in a complete non-emission state, a phenomenon in which the light-emitting device OLED finely emits light in response to a black grayscale of a next frame may be prevented.

The second initialization voltage VINT2 has a level that is higher than that of the first initialization voltage VINT1 and lower than a voltage level that is higher than the second driving voltage ELVSS by a threshold voltage of the light-emitting device OLED. Because the light-emitting device OLED has a relatively large size, the light-emitting device OLED has a large capacitance. In addition, because the level of the first initialization voltage VINT1 is too low, the light-emitting device OLED starts emitting light after a considerable delay in a next frame. However, according to the embodiment, the anode of the light-emitting device OLED is initialized to the second initialization voltage VINT2 having a higher level than the first initialization voltage VINT1, and thus, the light-emitting device OLED may emit light in a short period of time in the next frame. That is, a light emission delay may be addressed.

The first scan signal GW_i and the third scan signal GB_i may be substantially synchronized with each other, and in this case, the data writing period and the anode initialization period may be the same period.

When receiving the emission control signal EM_i of a low level, the first emission control TFT T5 and the second emission control TFT T6 are turned on, and the driving TFT T1 outputs the driving current Id corresponding to the voltage stored in the storage capacitor Cst, that is, the voltage (ELVDD-Dj) reduced from the source-gate voltage (ELVDD-Dj+|Vth|) of the driving TFT T1 by the threshold voltage (|Vth|) of the driving TFT T1. Then, the light-emitting device OLED may emit light with a luminance corresponding to the magnitude of the driving current Id.

Figure 3:
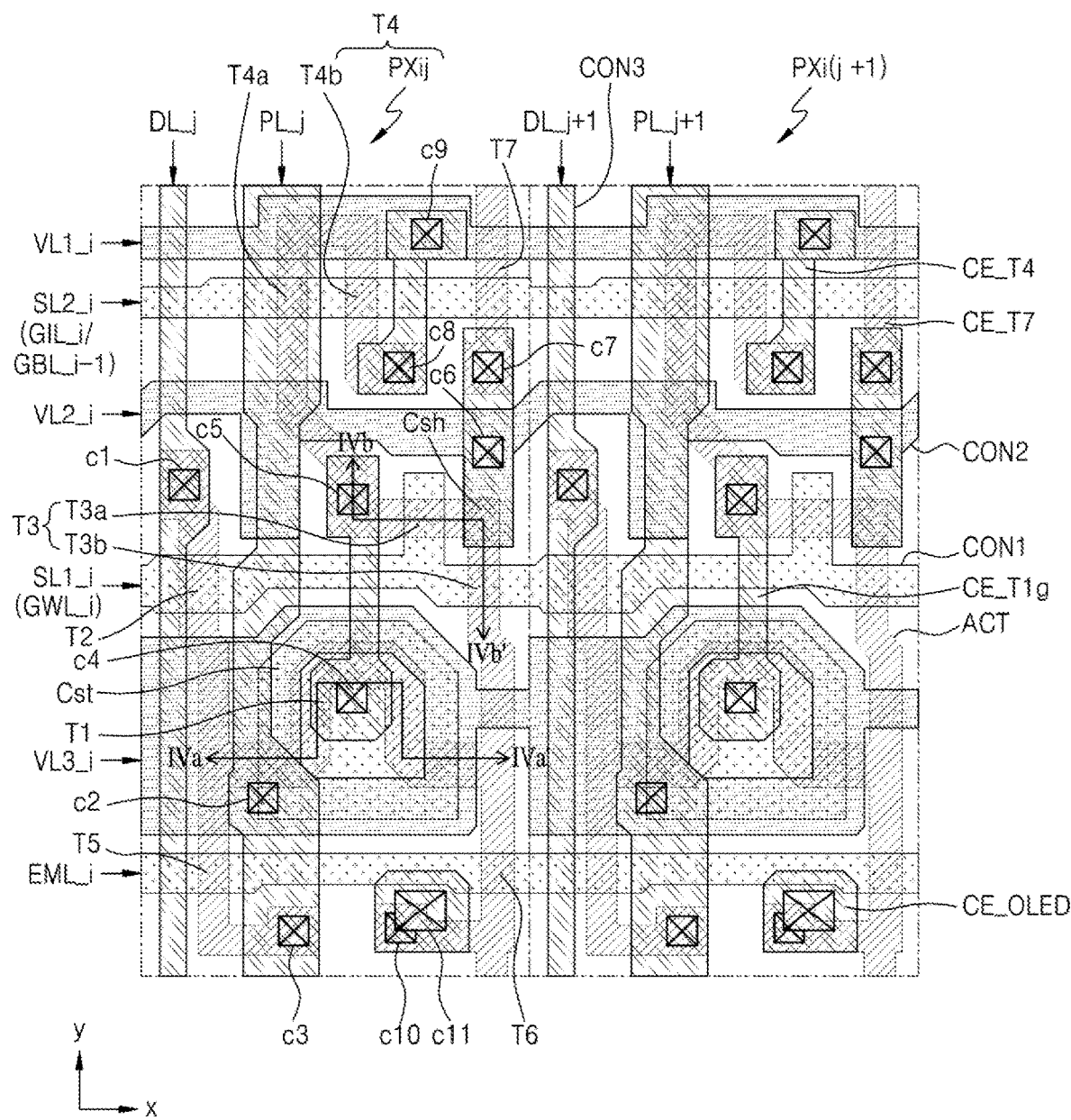
FIG. 3 is a plan view showing an example of the pixel of FIG. 2 implemented on a substrate.
Figure 4A:
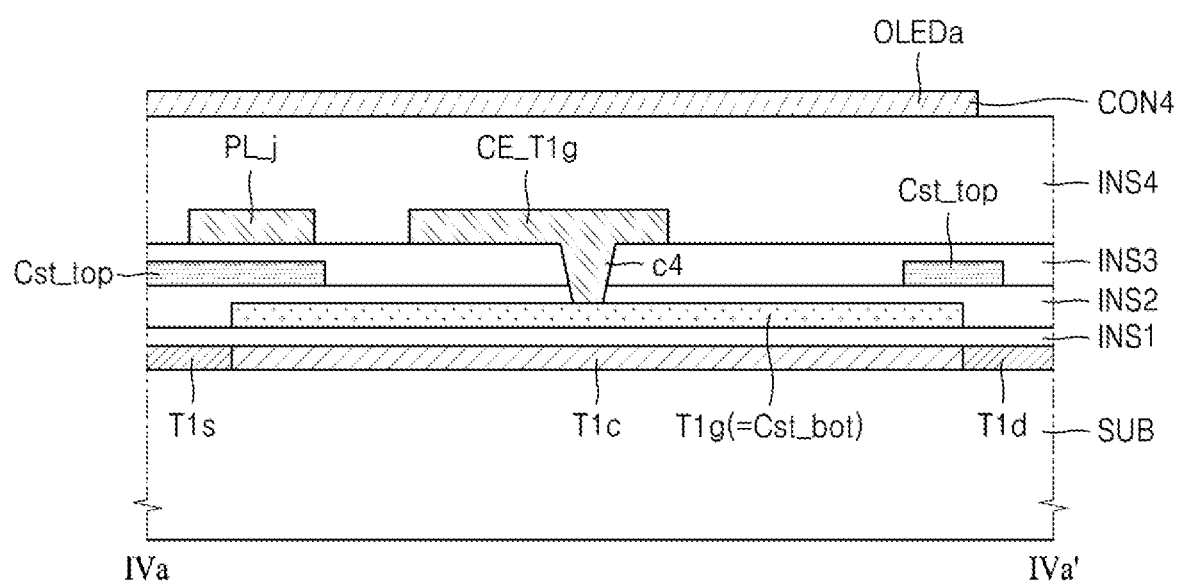
FIGS. 4A and 4B are cross-sectional views of the pixel of FIG. 3 taken along line IVa-IVa' and line IVb-IVb'.
Figure 4B:
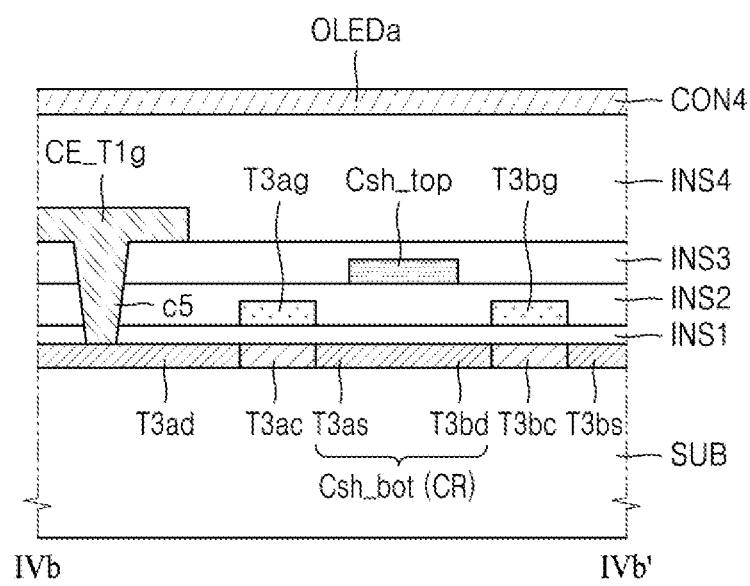

FIG. 3 is a plan view showing an example of the pixel of FIG. 2 implemented on a substrate. FIGS. 4A and 4B are cross-sectional views of the pixel of FIG. 3 taken along line IVa-IVa' and line IVb-IVb'.

Descriptions below are provided with reference to FIGS. 2, 3, 4A and 4B. FIG. 3 shows two pixels PXij and PXi(j+1) that are adjacent to each other in a row direction (x). The pixel PXij may correspond to the pixel PXij of FIG. 1 and FIG. 2. In FIG. 3, the row direction (x) may be referred to as the first direction and the column direction (y) may be referred to as the second direction. The plan view and the cross-sectional views of FIGS. 3, 4A, and 4B are exemplarily showing the pixel PXij and may be modified within the scope of one or more embodiments.

Referring to FIGS. 4A and 4B, the organic light-emitting display apparatus 100 (see FIG. 1) includes a substrate SUB, a semiconductor layer ACT (see FIG. 3) on the substrate SUB, a first conductive layer CON1 (see FIG. 3) on the semiconductor layer ACT, a second conductive layer CON2 (see FIG. 3) on the first conductive layer CON1, a third conductive layer CON3 (see FIG. 3) on the second conductive layer CON2, and a fourth conductive layer CON4 on the third conductive layer CON3. The organic light-emitting display apparatus 100 includes a first insulating layer INS1 between the semiconductor layer ACT and the first conductive layer CON1, a second insulating layer INS2 between the first conductive layer CON1 and the second conductive layer CON2, a third insulating layer INS3 between the second conductive layer CON2 and the third conductive layer CON3, and a fourth insulating layer INS4 between the third conductive layer CON3 and the fourth conductive layer CON4.

The first conductive layer CON1 may be referred to as a first gate electrode layer, the second conductive layer CON2 may be referred to as a second gate electrode layer, the third conductive layer CON3 may be referred to as a first source/drain electrode layer, and the fourth conductive layer CON4 may be referred to as a first pixel electrode layer. The first insulating layer INS1 may be referred to as a first gate insulating layer, the second insulating layer INS2 may be referred to as a second gate insulating layer, the third insulating layer INS3 may be referred to as an interlayer insulating layer, and the fourth insulating layer INS4 may be referred to as a planarization layer.

The organic light-emitting display apparatus 100 includes a plurality of pixels PX arranged on the substrate SUB in the row direction (x) and the column direction (y). The plurality of pixels PX include the two pixels PXij and PXi(j+1). The pixel PXij is described above with reference to FIGS. 1 and 2, and detailed descriptions thereof are omitted.

The organic light-emitting display apparatus 100 includes the first scan lines SL1_1 to SL1_m, the second scan lines SL2_1 to SL2_m+1, the emission control lines EML_1 to EML_m, the first voltage lines VL1_1 to VL1_m, and the second voltage lines VL2_1 to VL2_m extending on the substrate SUB in the row direction (x). The organic light-emitting display apparatus 100 includes the data lines DL_1 to DL_n and the power lines PL_1 to PL_n extending on the substrate SUB in the column direction (y).

The first scan lines SL1_1 to SL1_m respectively correspond to the first scan lines GWL_1 to GWL_m, the second scan lines SL2_1 to SL2_m respectively correspond to the second scan lines GIL_1 to GIL_m, and the second scan lines SL2_2 to SL2_m+1 respectively correspond to the third scan lines GBL_1 to GBL_m. The first scan line SL1_i may physically implement the function of the first scan line GWL_i, and the second scan line SL2_i may physically implement the functions of the second scan line GIL_i and the third scan line GBL_i−1.

Referring to FIG. 3, the first to seventh TFTs T1 to T7 are shown. The first to sixth TFTs T1 to T6 are included in the pixel PXij, but the seventh TFT T7 is included in a pixel PX(i−1)j of a previous row. Although not shown in FIG. 3, the pixel PXij also includes the seventh TFT T7 (not shown in FIG. 3) corresponding to the seventh TFT T7 of the pixel PX(i−1)j. One of ordinary skill in the art would understand that the seventh TFT T7 (not shown in FIG. 3) of the pixel PXij is connected to the sixth TFT T6 and is controlled by the third scan signal GB_i transferred through the third scan line GBL_i (not shown in FIG. 3).

The pixel PXij includes the first to seventh TFTs T1 to T7, the storage capacitor Cst, and the shield capacitor Csh. The pixel PXij is connected to the first scan line SL1_i, the second scan line SL2_i, the emission control line EML_i, the first voltage line VL1_i, the second voltage line VL2_i, the data line DL_j, and the power line PL_j. The seventh TFT T7 (not shown in FIG. 3) of the pixel PXij is connected to the third scan line SL2_i+1 (not shown in FIG. 3) and the second voltage line VL2_i+1 (not shown in FIG. 3).

The first to seventh TFTs T1 to T7 are arranged along the semiconductor layer ACT, and the semiconductor layer ACT is variously bent. The semiconductor layer ACT may include polysilicon or an oxide semiconductor. The oxide semiconductor may include an oxide including titanium (Ti), hafnium (Hf), zirconium (Zr), aluminum (Al), tantalum (Ta), germanium (Ge), zinc (Zn), gallium (Ga), tin (Sn), or indium (In), or a composite oxide thereof. When the semiconductor layer ACT includes an oxide semiconductor, an additional protective layer may be added in order to protect the oxide semiconductor that is vulnerable to an external environment such as high temperature.

The semiconductor layer ACT includes a channel region, a source region, and a drain region in each of the first to seventh TFTs T1 to T7. As shown in FIG. 4A, the semiconductor layer ACT includes a first source region T1s, a first drain region T1d, and a first channel region Tc1 between the source region T1s and the first drain region T1d of the first TFT T1.

As shown in FIG. 4B, the semiconductor layer ACT includes a first compensation channel region T3ac of the first compensation TFT T3a, a second compensation channel region T3bc of the second compensation TFT T3b, and a conductive region CR between the first and second compensation channel regions T3ac and T3bc. The conductive region CR includes a source region T3 as of the first compensation TFT T3a and a drain region T3bd of the second compensation TFT T3b, and may act as a lower electrode Csh_bot of the shield capacitor Csh. The semiconductor layer ACT includes a drain region T3ad of the first compensation TFT T3a and a source region T3bs of the second compensation TFT T3b.

The first channel region of the first TFT T1 acting as the driving TFT is curved and may have an Ω-shape. When the first channel region is curved, a long channel length of the first channel region may be ensured. Accordingly, a driving range of the gate voltage applied to the gate electrode of the first TFT T1 may be increased. The grayscale of the light emitted from the light-emitting device OLED may be finely controlled by changing the magnitude of the gate voltage, and a resolution and display quality of the organic light-emitting display apparatus 100 may be improved. The shape of the first channel region may be variously modified, e.g., 'reverse-S', 'S', 'M', 'W', etc.

The first conductive layer CON1 includes the first scan line SL1_i, the second scan line SL2_i, the emission control line EML_i, and the first gate electrode T1g (see FIG. 4A) of the first TFT T1 functioning as the driving TFT. Although not shown in FIG. 3, the first conductive layer CON1 includes the third scan line SL2_i+1.

The first scan line SL1_i includes a gate electrode of the second TFT T2, a first compensation gate electrode T3ag (see FIG. 4B) of the first compensation TFT T3a, and a second compensation gate electrode T3bg (see FIG. 4B) of the second compensation TFT T3b. The first scan line SL1_i extends in the row direction (x) and has a protrusion in the column direction (y). The protrusion of the first scan line SL1_i may function as the first compensation gate electrode T3ag of the first compensation TFT T3a.

The second scan line SL2_i includes a first initialization gate electrode of the first initialization TFT T4a, a second initialization gate electrode of the second initialization TFT T4b, and a seventh gate electrode of the seventh TFT T7 in the pixel PX(i−1)j of a previous row. The second scan line SL2_i extends in the row direction (x). Although not shown in FIG. 3, the third scan line SL2_i+1 includes a first initialization gate electrode of a first initialization TFT T4a in the pixel PX(i+1)j of the next row, a second initialization gate electrode of a second initialization TFT T4b in the pixel PX(i+1)j of the next row, and the seventh gate electrode of the first TFT T7 in the pixel PXij.

The emission control line EML_i includes a gate electrode of the fifth TFT T5 and a gate electrode of the sixth TFT T6. The emission control line EML_i entirely extends in the row direction (x).

The gate electrode in each of the first to seventh TFTs T1 to T7 overlaps the channel region in each of the first to seventh TFTs T1 to T7. As shown in FIG. 4A, the first gate electrode T1g of the first TFT T1 overlaps the first channel region T1c of the first TFT T1 and acts as a lower electrode Cst_bot of the storage capacitor Cst. As shown in FIG. 4B, the first compensation gate electrode T3ag of the first compensation TFT T3a and the second compensation gate electrode T3bg of the second compensation TFT T3b respectively overlap the first compensation channel region T3ac of the first compensation TFT T3a and the second compensation channel region T3bc of the second compensation TFT T3b.

The second conductive layer CON2 includes an upper electrode Csh_top (see FIG. 4B) of the shield capacitor Csh. As shown in FIG. 4B, the upper electrode Csh_top of the shield capacitor Csh at least partially overlaps the conductive region CR of the semiconductor layer ACT.

The second conductive layer CON2 further includes the first voltage line VL1 the second voltage line VL2_i, and an upper electrode Cst_top (see FIG. 4A) of the storage capacitor Cst. The first voltage line VL1_i is configured to transfer the first initialization voltage VINT1 and extends in the row direction (x).

The second voltage line VL2_i is configured to transfer the second initialization voltage VINT2 and extends in the row direction (x), but the second voltage line VL2_i includes a protrusion in the column direction (−y) so as to overlap the lower electrode Csh_bot of the semiconductor layer ACT. The protrusion from the second voltage line VL2_i may act as the upper electrode Csh_top of the shield capacitor Csh.

As shown in FIGS. 3 and 4A, the upper electrode Cst_top of the storage capacitor Cst at least partially overlaps the lower electrode Cst_bot. The upper electrode Cst_top extends in the row direction (x) to form a third voltage line VL3_i. The power lines PL_1 to PL_n extending in the column direction (y) and the upper electrode Cst_top extending in the row direction (x) may be connected to each other via a plurality of second contact plugs C2 to form a mesh structure. The first driving voltage ELVDD is supplied entirely to the display 110 through the mesh structure, and thus, a level variation of the first driving voltage ELVDD applied to the pixels PX may be reduced.

The first scan line SL1_i, the second scan line SL2_i, and the emission control line EML_i included in the first conductive layer CON1 extend in the row direction (x), and the first voltage line VL1_i and the second voltage line VL2_i included in the second conductive layer CON2 also extend in the row direction (x). As shown in FIG. 3, the first voltage line VL1_i, the second scan line SL2_i, the second voltage line VL2_i, the first scan line SL1_i, and the emission control line EML_i are sequentially provided in the column direction (y) (downward in FIG. 3). The second scan line SL2_i extends in the row direction (x) between the first voltage line VL1_i and the second voltage line VL2_i, and the second voltage line VL2_i extends in the row direction (x) between the second scan line SL2_i and the first scan line SL1_i.

The third conductive layer CON3 includes the data line DL_j and the power line PL_j. The data line DL_j entirely extends in the column direction (y), and the power line PL also entirely extends in the column direction (y). The data line DL_j is electrically connected to the source region of the second TFT T2 in the semiconductor layer ACT via a first contact plug c1. The power line PL_j is electrically connected to the upper electrode Cst_top of the second conductive layer CON2 via the second contact plug c2, and is electrically connected to the source region of the fifth TFT T5 in the semiconductor layer ACT via a third contact plug c3.

The third conductive layer CON3 includes a plurality of connecting electrodes CE_T1g, CE_T7, CE_T4, and CE_OLED. As shown in FIGS. 4A and 4B, a gate connecting electrode CE_T1g includes fourth and fifth contact plugs c4 and c5, and electrically connects the first gate electrode T1g of the first TFT T1 in the first conductive layer CON1 with the drain region T3ad of the first compensation TFT T3a in the semiconductor layer ACT.

A first initialization connecting electrode CE_T4 includes eighth and ninth contact plugs c8 and c9, and electrically connects the drain region of the fourth TFT T4 in the semiconductor layer ACT with the first voltage line VL1_i in the second conductive layer CON2. A second initialization connecting electrode CE_T7 includes sixth and seventh contact plugs c6 and c7, and electrically connects the second voltage line VL2_i of the second conductive layer CON2 with the drain region of the seventh TFT T7 in the semiconductor layer ACT. An intermediate connecting electrode CE_OLED includes a tenth contact plug c10 connected to the drain region of the sixth TFT T6. An eleventh contact plug c11 is connected to the intermediate connecting electrode CE_OLED, and the eleventh contact plug c11 electrically connects the intermediate connecting electrode CE_OLED with an anode electrode OLEDa of the light-emitting device OLED.

The fourth conductive layer CON4 includes the anode electrode OLEDa (see FIGS. 4A and 4B) of the light-emitting device OLED. The anode electrode OLEDa is electrically connected to the drain region of the sixth TFT T6 via the tenth and eleventh contact plugs c10 and c11 and the intermediate connecting electrode CE_OLED. Although not shown in the drawings, an organic emission layer and a common electrode may be on the anode electrode OLEDa of the light-emitting device OLED, and the organic emission layer may emit light due to a current flowing between the anode electrode OLEDa and the common electrode.

As shown in FIG. 3, the conductive region CR of the semiconductor layer ACT is adjacent to a data line DL_j+1 of a next column. Because m data voltages D1 to Dm are applied to the data line DL_j+1 during one frame, a voltage level of the data line DL_j+1 fluctuates very quickly. The data line DL_j is also adjacent to the conductive region CR, and a voltage level of the data line DL_j also changes very quickly. Even when the voltage level of a conductor around the conductive region CR quickly and largely changes, the voltage level of the conductive region CR is maintained by the shield capacitor Csh. Thus, changing of the voltage level of the floating node FN in the third TFT T3 depending on the voltage fluctuation of the peripheral conductor may be prevented, or at least reduced.

Figure 5:
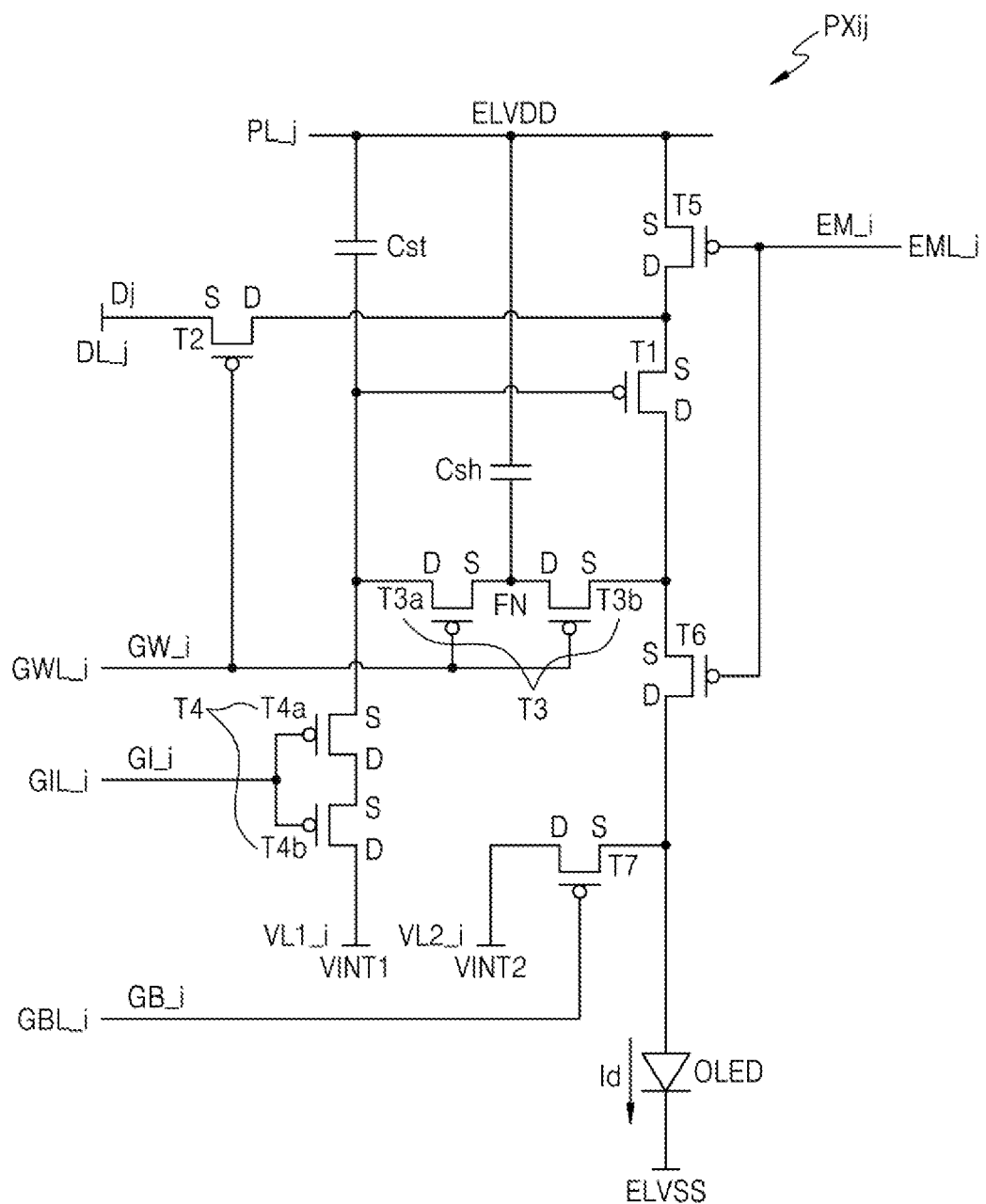
FIG. 5 is an equivalent circuit diagram of a pixel according to another exemplary embodiment of the invention.

FIG. 5 is an equivalent circuit diagram of the pixel PXij according to another exemplary embodiment.

Referring to FIG. 5, the pixel PXij of FIG. 5 is substantially the same as the pixel PXij of FIG. 2, except for the shield capacitor Csh. Differences from FIG. 2 will be described below, and descriptions about the same components will be omitted.

The shield capacitor Csh is connected between the floating node FN and the power line PL_j. The shield capacitor Csh may have an upper electrode connected to the power line PL_j and a lower electrode connected to the floating node FN. The upper electrode of the shield capacitor Csh may be connected to the power line PL_j.

When there is no shield capacitor Csh, the floating node FN floats when the first and second compensation TFTs T3a and T3b are turned off. Thus, an electric potential of the floating node FN may fluctuate according to a voltage variation in peripheral signal lines, and charges stored in the storage capacitor Cst may slowly leak through the first and second compensation TFTs T3a and T3b.

According to the embodiment, even when the first and second compensation TFTs T3a and T3b are turned off, the first driving voltage ELVDD is continuously applied to the upper electrode of the shield capacitor Csh, and thus, the voltage at the floating node FN may be maintained due to the shield capacitor Csh. There is a parasitic capacitance between the floating node FN and other signal lines. Even when voltages of the other signal lines change, the variation in the voltage of the floating node FN may be noticeably reduced by the shield capacitor Csh.

Figure 6:
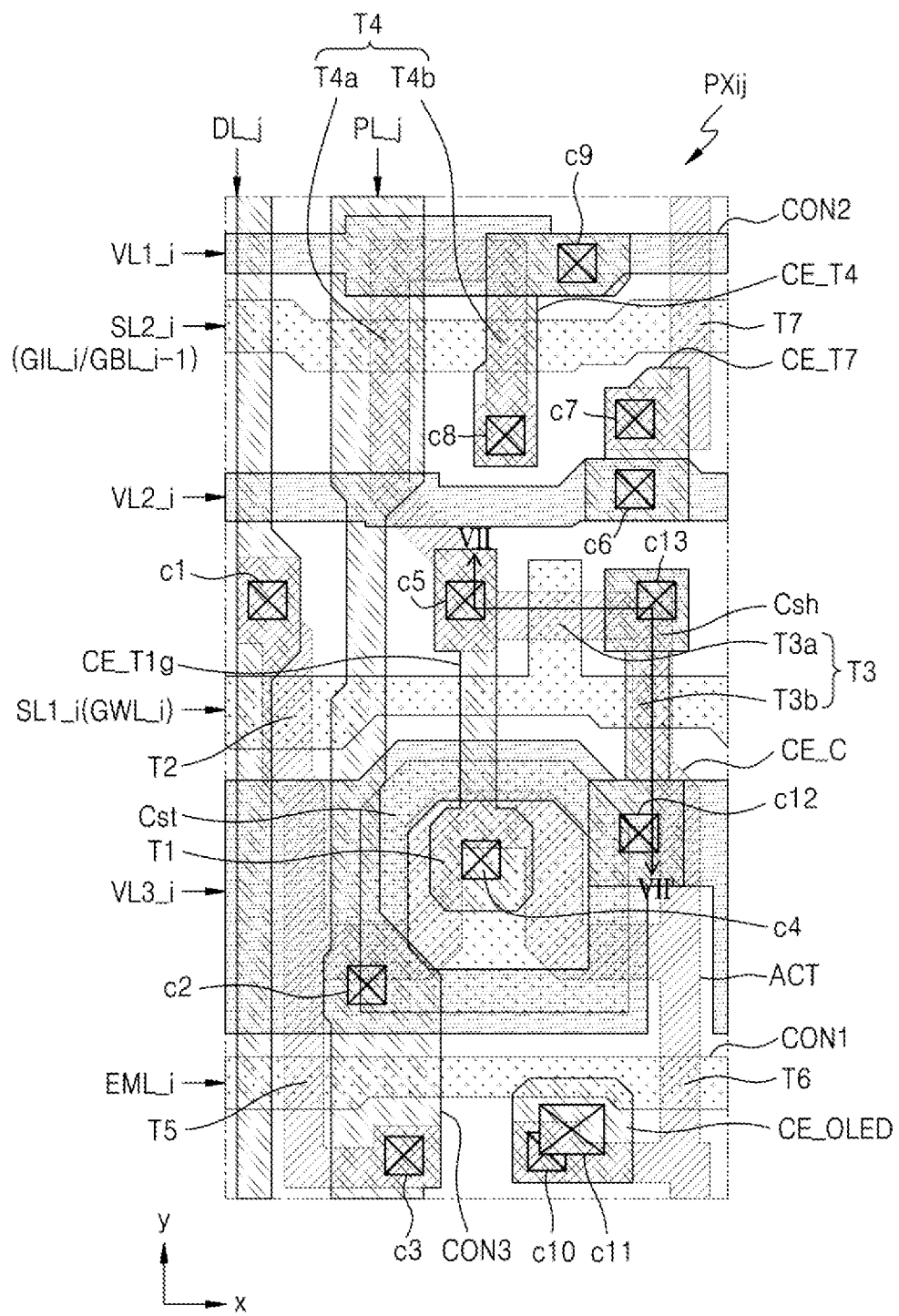
FIG. 6 is a plan view showing an example of the pixel of FIG. 5 implemented on a substrate.
Figure 7:
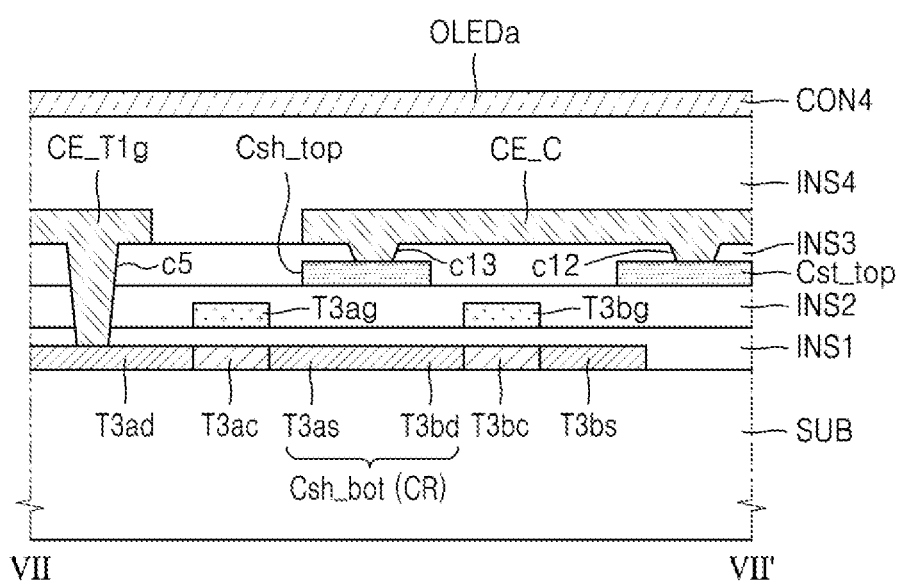
FIG. 7 is a cross-sectional view of the pixel of FIG. 6 taken along line VII-VII'.

FIG. 6 is a plan view showing an example of the pixel PXij of FIG. 5 implemented on a substrate. FIG. 7 is a cross-sectional view of the pixel of FIG. 6 taken along line VII-VII'.

Descriptions below are provided with reference to FIGS. 5, 6, and 7. The pixel PXij may correspond to the pixel PXij of FIG. 1 and FIG. 5. In FIG. 6, the row direction (x) may be referred to as a first direction and a column direction (y) may be referred to as a second direction. The plan view and the cross-sectional view of FIGS. 6 and 7 are exemplarily showing the pixel PXij and may be modified within the scope of the disclosure.

Referring to FIG. 7, the organic light-emitting display apparatus 100 (see FIG. 1) includes the substrate SUB, the semiconductor layer ACT (see FIG. 6) on the substrate SUB, the first conductive layer CON1 (see FIG. 6) on the semiconductor layer ACT, the second conductive layer CON2 (see FIG. 6) on the first conductive layer CON1, the third conductive layer CON3 (see FIG. 6) on the second conductive layer CON2, and the fourth conductive layer CON4 on the third conductive layer CON3. The organic light-emitting display apparatus 100 includes a first insulating layer INS1 between the semiconductor layer ACT and the first conductive layer CON1, a second insulating layer INS2 between the first conductive layer CON1 and the second conductive layer CON2, a third insulating layer INS3 between the second conductive layer CON2 and the third conductive layer CON3, and a fourth insulating layer INS4 between the third conductive layer CON3 and the fourth conductive layer CON4.

The organic light-emitting display apparatus 100 includes a plurality of pixels PX, e.g., the pixel PXij, arranged on the substrate SUB in the row direction (x) and the column direction (y). The pixel PXij is described above with reference to FIGS. 1 and 5, and detailed descriptions thereof are omitted.

The organic light-emitting display apparatus 100 includes the first scan lines SL1_1 to SL1_m, the second scan lines SL2_1 to SL2_m+1, the emission control lines EML_1 to EML_m, the first voltage lines VL1_1 to VL1_m, and the second voltage lines VL2_1 to VL2_m extending on the substrate SUB in the row direction (x). The organic light-emitting display apparatus 100 includes the data lines DL_1 to DL_n and the power lines PL_1 to PL_n extending on the substrate SUB in the column direction (y).

Referring to FIG. 6, the first to seventh TFTs T1 to T7 are shown. The first to sixth TFTs T1 to T6 are included in the pixel PXij, but the seventh TFT T7 is included in a pixel PX(i−1)j of a previous row. Although not shown in FIG. 7, the pixel PXij includes the seventh TFT T7 (not shown in FIG. 6) corresponding to the seventh TFT T7 of the pixel PX(i−1)j. The seventh TFT T7 (not shown in FIG. 6) of the pixel PXij is connected to the sixth TFT T6 and is controlled by the third scan signal GB_i transferred through the third scan line GBL_i (not shown in FIG. 7).

The pixel PXij includes the first to seventh TFTs T1 to T7, the storage capacitor Cst, and the shield capacitor Csh. The pixel PXij is connected to the first scan line SL1_i, the second scan line SL2_i, the emission control line EML_i, the first voltage line VL1_i, the second voltage line VL2_i, the data line DL_j, and the power line PL_j. The seventh TFT T7 (not shown in FIG. 6) of the pixel PXij is connected to the third scan line SL2_i+1 (not shown in FIG. 6) and the second voltage line VL2_i+1 (not shown in FIG. 6).

The first to seventh TFTs T1 to T7 are arranged along the semiconductor layer ACT, and the semiconductor layer ACT is variously bent. The semiconductor layer ACT includes a channel region, a source region, and a drain region in each of the first to seventh TFTs T1 to T7. As shown in FIG. 7, the semiconductor layer ACT includes a first compensation channel region T3ac of the first compensation TFT T3a, a second compensation channel region T3bc of the second compensation TFT T3b, and a conductive region CR between the first and second compensation channel regions T3ac and T3bc. The conductive region CR includes a source region T3as of the first compensation TFT T3a and a drain region T3bd of the second compensation TFT T3b, and may act as a lower electrode Csh_bot of the shield capacitor Csh. The semiconductor layer ACT includes a drain region T3ad of the first compensation TFT T3a and a source region T3bs of the second compensation TFT T3b.

The first conductive layer CON1 includes the first scan line SL1_i, the second scan line SL2_i, the emission control line EML_i, and the first gate electrode T1g of the first TFT T1. Although not shown in FIG. 6, the first conductive layer CON1 includes the third scan line SL2_i+1 connected to the pixel PXij.

The first scan line SL1_i includes a gate electrode of the second TFT T2, a first compensation gate electrode of the first compensation TFT T3a, and a second compensation gate electrode of the second compensation TFT T3b. As shown in FIG. 6, the first scan line SL1_i extends in the row direction (x), and has a portion protruding in the column direction (y) in order to function as the first compensation gate electrode T3ag (see FIG. 7).

The second scan line SL2_i includes a first initialization gate electrode of the first initialization TFT T4a, a second initialization gate electrode of the second initialization TFT T4b, and a seventh gate electrode of the seventh TFT T7 in the pixel PX(i−1)j of a previous row. Although not shown in FIG. 6, the third scan line SL2_i+1 includes a first initialization gate electrode and a second initialization gate electrode of a pixel PX(i+1)j in a next row, and the seventh gate electrode of the pixel PXij. The emission control line EML_i includes a fifth gate electrode of the fifth TFT T5 and a sixth gate electrode of the sixth TFT T6.

The second conductive layer CON2 includes an upper electrode Csh_top of the shield capacitor Csh. As shown in FIG. 7, the upper electrode Csh_top of the shield capacitor Csh at least partially overlaps the conductive region CR of the semiconductor layer ACT. The upper electrode Csh_top is electrically connected to the power line PL_j to receive the first driving voltage ELVDD.

The second conductive layer CON2 further includes the first voltage line VL1 the second voltage line VL2_i, and an upper electrode Cst_top of the storage capacitor Cst. As shown in FIG. 6, the upper electrode Cst_top of the storage capacitor Cst at least partially overlaps the lower electrode Cst_bot, that is, the first gate electrode of the first TFT T1. The upper electrode Cst_top extends in the row direction (x) to form a third voltage line VL3_i extending in the row direction (x). The power lines PL_1 to PL_n extending in the column direction (y) and the third voltage lines VL3_i extending in the row direction (x) may be connected to each other via a plurality of second contact plugs c2 to form a mesh structure.

The third conductive layer CON3 includes the data line DL_j and the power line PL_j. The data line DL_j is electrically connected to the source region of the second TFT T2 in the semiconductor layer ACT via a first contact plug c1. The power line PL_j is electrically connected to the upper electrode Cst_top of the second conductive layer CON2 via the second contact plug c2, and is electrically connected to the source region of the fifth TFT T5 in the semiconductor layer ACT via a third contact plug c3.

The third conductive layer CON3 includes a plurality of connecting electrodes CE_T1g, CE_T7, CE_T4, CE_OLED, and CE_C. The gate connecting electrode CE_T1g includes the fourth and fifth contact plugs c4 and c5, and electrically connects the first gate electrode T1g in the first conductive layer CON1 and the drain region T3ad (see FIG. 7) of the first compensation TFT T3a in the semiconductor layer ACT with each other.

The first initialization connecting electrode CE_T4 includes the eighth and ninth contact plugs c8 and c9, and electrically connects the drain region of the fourth TFT T4 in the semiconductor layer ACT with the first voltage line VL1_i in the second conductive layer CON2. The second initialization connecting electrode CE_T7 includes the sixth and seventh contact plugs c6 and c7, and electrically connects the second voltage line VL2_i of the second conductive layer CON2 with the drain region of the seventh TFT T7 in the semiconductor layer ACT. The intermediate connecting electrode CE_OLED includes the tenth contact plug c10 connected to the drain region of the sixth TFT T6. The eleventh contact plug c11 is connected to the intermediate connecting electrode CE_OLED, and the eleventh contact plug c11 electrically connects the intermediate connecting electrode CE_OLED with an anode OLEDa of the light-emitting device OLED.

A capacitor connecting electrode CE_C includes twelfth and thirteenth contact plugs c12 and c13. The capacitor connecting electrode CE_C electrically connects the upper electrode Csh_top of the shield capacitor in the second conductive layer CON2 and the upper electrode Cst_top of the storage capacitor Cst in the second conductive layer CON2 with each other. Because the upper electrode Cst_top of the storage capacitor Cst is connected to the power line PL_j via the second contact plug c2, the upper electrode Csh_top of the shield capacitor Csh is also electrically connected to the power line PL_j. The first driving voltage ELVDD is always applied to the upper electrode Csh_top of the shield capacitor Csh.

The fourth conductive layer CON4 includes the anode electrode OLEDa (see FIG. 7) of the light-emitting device OLED. The anode electrode OLEDa is electrically connected to the drain region of the sixth TFT T6 via the tenth and eleventh contact plugs c10 and c11 and the intermediate connecting electrode CE_OLED. Although not shown in the drawings, an organic emission layer and a common electrode may be on the anode electrode OLEDa of the light-emitting device OLED, and the organic emission layer may emit light due to a current flowing between the anode OLEDa and the common electrode.

As shown in FIG. 6, even when the voltage level of the peripheral conductor fluctuates quickly and largely, the conductive region CR of the semiconductor layer ACT may maintain the voltage level due to the shield capacitor Csh, and thus, the change in the voltage level of the floating node FN of the third TFT T3 in accordance with the voltage variation of the peripheral conductor may be removed or reduced.

According to one or more exemplary embodiments of the inventive concepts, the first initialization voltage for initializing the gate of the driving TFT is applied to the pixel before writing data in the pixel and the second initialization voltage for initializing the anode of the light-emitting device is applied to the pixel before the light-emitting device emits light, and thus, the emission delay caused by the capacitor characteristics of the light-emitting device may be improved.

Despite the second voltage line configured to transfer the second initialization voltage and the first voltage line configured to transfer the first initialization voltage passing through the pixel, a planar area of the pixel is not increased under the existing design rule without adding a new conductive layer, and thus, the resolution may be improved.

The floating node of the compensation TFT connected between the gate and the drain of the driving TFT is shielded by using the driving voltage or the second initialization voltage, and thus, the crosstalk characteristics may not be degraded. Therefore, the display quality of the display apparatus may be improved.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An organic light-emitting display apparatus comprising:
   a substrate extending in a first direction and a second direction;
   a first scan line, a second scan line, and a third scan line configured to respectively transfer a first scan signal, a second scan signal, and a third scan signal, the first-to-third scan lines extending in the first direction;
   a data line configured to transfer a data voltage and extending in the second direction;
   a power line configured to transfer a driving voltage;
   a first voltage line and a second voltage line configured to respectively transfer a first initialization voltage and a second initialization voltage and extending in the first direction; and
   a plurality of pixels provided on the substrate in the first direction and the second direction,
   wherein:
   each of the plurality of pixels comprises:
     a light-emitting device;
     a driving thin film transistor (TFT) for controlling a magnitude of a current flowing from the power line to the light-emitting device according to a gate-source voltage;
     a storage capacitor disposed between the power line and a gate of the driving TFT;
     a scan TFT configured to transfer the data voltage to a source of the driving TFT in response to the first scan signal;
     a first compensation TFT and a second compensation TFT connected to each other in series to connect a drain of the driving TFT to the gate of the driving TFT in response to the first scan signal;
     a gate initialization TFT configured to apply the first initialization voltage to the gate of the driving TFT in response to the second scan signal; and
     an anode initialization TFT configured to apply the second initialization voltage to an anode of the light-emitting device in response to the third scan signal; and
   on a pixel row composed of pixels on a same row among the plurality of pixels, the second voltage line is disposed between the first voltage line and the first scan line in the second direction in a plan view.

2. The organic light-emitting display apparatus of claim 1, wherein:
   the first scan line includes a first compensation gate functioning as an electrode gate of the first compensation TFT, and a second compensation gate electrode functioning as a gate of the second compensation TFT;
   the second voltage line includes a protruding electrode extending in the second direction toward the first scan line; and
   the protruding electrode of the second voltage line is disposed between the first compensation gate electrode and the second compensation gate electrode.

3. The organic light-emitting display apparatus of claim 2, wherein:
   a channel length direction of the first compensation TFT is the first direction, and a channel length direction of the second compensation TFT is the second direction; and
   the protruding electrode is located in the first direction from a first compensation channel region of the first compensation TFT, and in the second direction from a second compensation channel region of the second compensation TFT.

4. The organic light-emitting display apparatus of claim 2, further comprising:

a semiconductor layer disposed on the substrate and including a first compensation channel region of the first compensation TFT;
a second compensation channel region of the second compensation TFT; and
a compensation conductive region between the first compensation channel region and the second compensation channel region,
wherein the compensation conductive region of the semiconductor layer overlaps the protruding electrode.

5. The organic light-emitting display apparatus of claim 1, further comprising:
a semiconductor layer disposed on the substrate and including a first compensation channel region of the first compensation TFT, a second compensation channel region of the second compensation TFT, and a compensation conductive region between the first compensation channel region and the second compensation channel region;
a first conductive layer disposed on the semiconductor layer and including a driving gate electrode of the driving TFT that is a lower electrode of the storage capacitor, a first compensation gate electrode of the first compensation TFT, and a second compensation gate electrode of the second compensation TFT; and
a second conductive layer disposed on the first conductive layer and including the second voltage line and an upper electrode of the storage capacitor.

6. The organic light-emitting display apparatus of claim 5, wherein the second voltage line and the upper electrode of the storage capacitor are disposed on a same layer as parts of the second conductive layer.

7. The organic light-emitting display apparatus of claim 5, wherein:
the first conductive layer further includes the first to third scan lines; and
the second conductive layer further includes the first voltage line.

8. The organic light-emitting display apparatus of claim 5, further comprising a third conductive layer disposed on the second conductive layer and including an anode initialization connection electrode,
wherein:
the semiconductor layer further includes first and second areas of the anode initialization TFT and a channel region between the first and second areas; and
the anode initialization connection electrode connects the second area of the anode initialization TFT to the second voltage line.

9. The organic light-emitting display apparatus of claim 8, wherein:
the third conductive layer further includes the data line, the power line, and a gate initialization connection electrode;
the semiconductor layer further includes first and second areas of the gate initialization TFT and a channel region between the first and second areas; and
the gate initialization connection electrode connects the second area of the gate initialization TFT to the first voltage line.

10. The organic light-emitting display apparatus of claim 1, further comprising an emission control line configured to transfer an emission control signal and extending in the first direction,
wherein each of the plurality of pixels comprises:
a first emission control TFT connecting the power line to the source of the driving TFT in response to the emission control signal; and
a second emission control TFT connecting the drain of the driving TFT to the anode of the light-emitting device in response to the emission control signal.

11. The organic light-emitting display apparatus of claim 1, further comprising a shield capacitor between a floating node between the first and second compensation TFTs and the second voltage line.

12. The organic light-emitting display apparatus of claim 11, wherein:
the shield capacitor includes an upper electrode, a lower electrode, and a dielectric layer disposed between the upper electrode and the lower electrode;
the lower electrode includes a conductive region of a semiconductor layer; and
the upper electrode is a part of the second voltage line.

13. The organic light-emitting display apparatus of claim 1, wherein, on the pixel row, the second scan line is disposed between the first voltage line and the second voltage line in the second direction.

14. The organic light-emitting display apparatus of claim 1, wherein, on the pixel row, the second voltage line is disposed between the second scan line and the first scan line in the second direction.

15. The organic light-emitting display apparatus of claim 1, wherein a level of the second initialization voltage is higher than a level of the first initialization voltage.

16. A pixel configured to receive a first scan signal, a second scan signal, a third scan signal, and a data voltage, and connected to a power line configured to transfer a driving voltage and a first voltage line and a second voltage line configured to respectively transfer a first initialization voltage and a second initialization voltage, the pixel comprising:
a light-emitting device;
a driving thin film transistor (TFT) for controlling a magnitude of a current flowing from the power line to the light-emitting device according to a gate-source voltage;
a storage capacitor disposed between the power line and a gate of the driving TFT;
a scan TFT configured to transfer the data voltage to a source of the driving TFT in response to the first scan signal;
a first compensation TFT and a second compensation TFT operating in response to the first scan signal and connected in series to each other between a drain and the gate of the driving TFT;
a gate initialization TFT configured to apply the first initialization voltage to the gate of the driving TFT in response to the second scan signal;
an anode initialization TFT configured to apply the second initialization voltage to an anode of the light-emitting device in response to the third scan signal;
a semiconductor layer including a first compensation channel region of the first compensation TFT, a second compensation channel region of the second compensation TFT, and a compensation conductive region between the first compensation channel region and the second compensation channel region; and
a protruding electrode, as a part of the second voltage line, overlapping the compensation conductive region.

17. The pixel of claim 16, further comprising:
as a part of the first scan line, a first compensation gate electrode of the first compensation TFT; and as a part of the first scan line, a second compensation gate electrode of the second compensation TFT, wherein the protruding electrode is disposed between the first compensation gate electrode and the second compensation gate electrode.

18. The pixel of claim 16, further comprising:

a first conductive layer disposed on the semiconductor layer and including a driving gate electrode of the driving TFT that is a lower electrode of the storage capacitor, a first compensation gate electrode of the first compensation TFT, and a second compensation gate electrode of the second compensation TFT; and a second conductive layer disposed on the first conductive layer and including the protruding electrode and an upper electrode of the storage capacitor.

19. The pixel of claim 18, further comprising a third conductive layer disposed on the second conductive layer and including an anode initialization connection electrode, wherein:

the semiconductor layer further includes first and second areas of the anode initialization TFT and a channel region between the first and second areas; and the anode initialization connection electrode connects the second area of the anode initialization TFT to the second voltage line.

20. The pixel of claim 16, further comprising a shield capacitor including the compensation conductive region as a lower electrode and the protruding electrode as an upper electrode.

\* \* \* \* \*